US008455880B2

(12) United States Patent
Park et al.

(10) Patent No.: US 8,455,880 B2
(45) Date of Patent: Jun. 4, 2013

(54) LIGHT EMITTING DEVICE AND LIGHT EMITTING DEVICE PACKAGE

(75) Inventors: Hyung Jo Park, Seoul (KR); Hyun Kyong Cho, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 26 days.

(21) Appl. No.: 13/023,100

(22) Filed: Feb. 8, 2011

(65) Prior Publication Data

US 2011/0193093 A1 Aug. 11, 2011

(30) Foreign Application Priority Data

Feb. 10, 2010 (KR) ........................ 10-2010-0012318

(51) Int. Cl.
*H01L 29/15* (2006.01)

(52) U.S. Cl.
USPC ...................... 257/76; 257/E33.025; 438/105

(58) Field of Classification Search
USPC ......... 257/76, 99, E33.025, E33.066, E33.68; 438/105, 931
See application file for complete search history.

(56) References Cited

U.S. PATENT DOCUMENTS

| | | | |
|---|---|---|---|
| 4,608,581 A | | 8/1986 | Bagratishvili et al. |
| 6,057,564 A | * | 5/2000 | Rennie ............................ 257/99 |
| 6,329,716 B1 | | 12/2001 | Nido et al. |
| 7,842,966 B2 | | 11/2010 | Watanabe et al. |
| 7,851,997 B2 | | 12/2010 | Ito et al. |
| 2006/0186417 A1 | | 8/2006 | Tsai et al. |
| 2009/0142871 A1 | | 6/2009 | Ohtsuka et al. |

FOREIGN PATENT DOCUMENTS

| | | | |
|---|---|---|---|
| EP | 1 655 786 | A2 | 5/2006 |
| EP | 165786 | * | 5/2006 |
| EP | 1655786 | A2 | 5/2006 |
| JP | 11-54798 | | 6/1989 |
| JP | 10-200161 | | 7/1998 |
| JP | 2002-353144 | | 12/2002 |
| JP | 2005-136156 | A | 5/2005 |
| JP | 2007-019124 | A | 1/2007 |
| JP | 2009-135181 | | 6/2009 |
| JP | 2010-225767 | | 10/2010 |
| KR | 10-2007-0115793 | A | 12/2007 |
| KR | 10-0874653 | B1 | 12/2008 |

OTHER PUBLICATIONS

June O. Song et al. "Highly low resistance and transparent Ni/ZnO ohmic contacts to p-type GaN", Applied Physics Letters, vol. 83, No. 3, Jul. 21, 2003, pp. 479-481.

Office Action for Chinese Patent Application No. 201110036993.4, dated Sep. 26, 2012.

* cited by examiner

*Primary Examiner* — Tony Tran
(74) *Attorney, Agent, or Firm* — McKenna Long & Aldridge LLP

(57) ABSTRACT

Provided is a light emitting device. A light emitting device includes: a conductive support member; a light emitting structure for generating a light on the conductive support member, the light emitting structure comprising a first conductive type semiconductor layer, a second conductive type semiconductor layer, and an active layer; an electrode on the light emitting structure; and an oxide layer between the electrode and the light emitting structure. The light emitting structure includes an oxygen-injected region where oxygen is injected on an upper portion of the light emitting structure.

5 Claims, 11 Drawing Sheets

100 A 170 165 135 163 130 140 145 150 155 156 157 158 160

LIGHT EMITTING DEVICE AND LIGHT EMITTING DEVICE PACKAGE

CROSS-REFERENCE TO RELATED APPLICATIONS

The present application claims priority under 35 U.S.C. §119(a) of Korean Patent Application No. 10-2010-0012318 filed on Feb. 10, 2010, which is hereby incorporated by reference in its entirety.

BACKGROUND

Embodiments relate to a light emitting device and a light emitting device package.

A light emitting diode (LED) is a semiconductor light emitting device converting current to light. In recent years, as the luminance of the LED increases gradually, the use of the LED as a light source for a display, a light source for a vehicle, and a light source for a lighting system is increasing. An LED emitting white light and having superior efficiency may be implemented by using a fluorescent material or combining individual LEDs that emit three primary colors.

The luminance of the LED depends on various conditions, such as the structure of an active layer, a light extracting structure capable of effectively extracting light to an outside, semiconductor material used in the LED, a chip size, and the type of a molding member enclosing the LED.

SUMMARY

Embodiments provide a light emitting device and a light emitting device package.

In one embodiment, a light emitting device includes: a conductive support member; a light emitting structure for generating a light on the conductive support member, the light emitting structure comprising a first conductive type semiconductor layer, a second conductive type semiconductor layer, and an active layer; an electrode on the light emitting structure; and an oxide layer between the electrode and the light emitting structure. The light emitting structure includes an oxygen-injected region where oxygen is injected on an upper portion of the light emitting structure.

In another embodiment, a light emitting device package includes: a package body; a first and second electrode layers on the package body; and a light emitting device on the package body, the light emitting body electrically connected to the first and second electrode layers. The light emitting device includes: a conductive support member; a light emitting structure for generating a light on the conductive support member; an electrode on the light emitting structure; and an oxide layer between the electrode and the light emitting structure. The light emitting structure includes an oxygen-injected region where oxygen is injected on an upper portion of the light emitting structure.

According to the embodiments, a contact resistance between an electrode and a semiconductor layer can be reduced, and a light emitting efficiency can be improved.

DETAILED DESCRIPTION OF THE EMBODIMENTS

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present. In addition, word "on," or "under," are will be described based on the accompanying drawings.

In the figures, the dimensions of layers and regions are exaggerated for clarity of illustration. In addition, the dimension of each part does not reflect an actual size.

Hereinafter, a light emitting device, a method of manufacturing the same, a light emitting device package, and a lighting system according to embodiments will be described with reference to the accompanying drawings.

Figure 1:
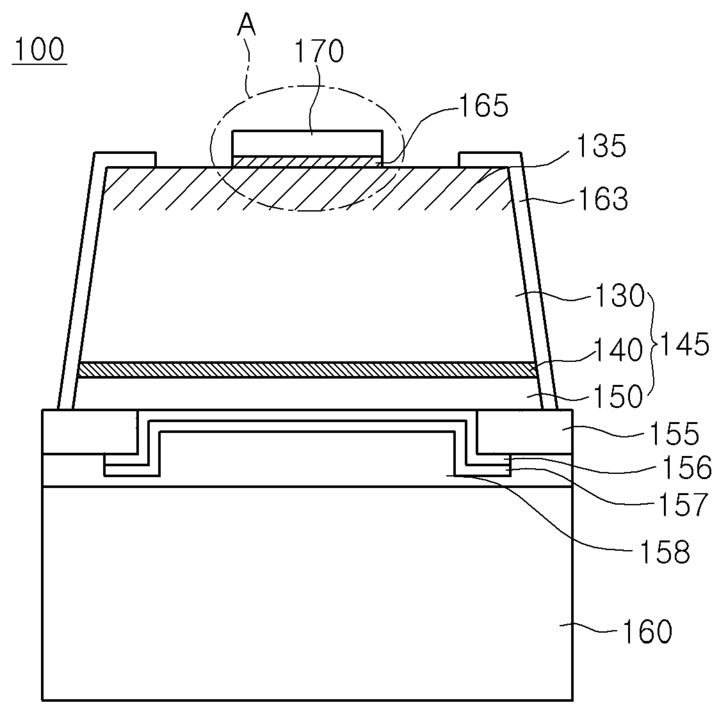
FIG. 1 is a cross-sectional view of a light emitting device according to an embodiment.
Figure 2:
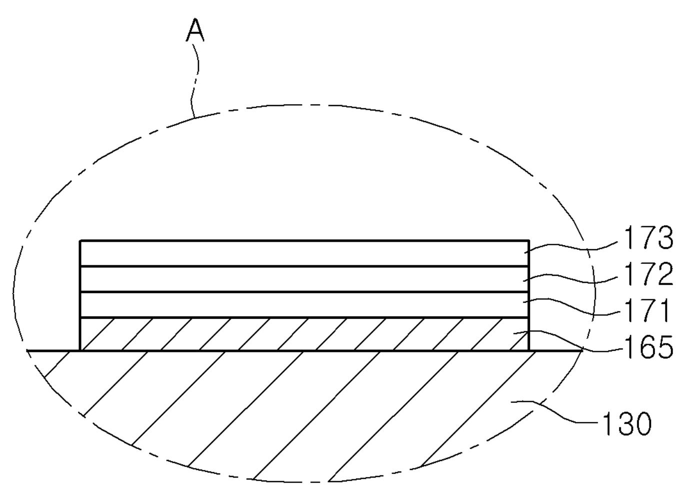
FIG. 2 is an extended view of an A portion in FIG. 1.
Figure 3:
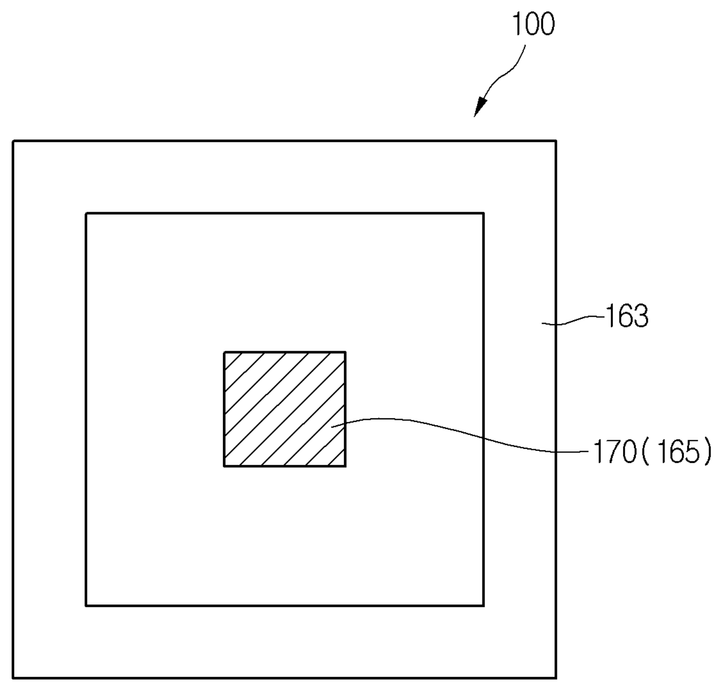
FIG. 3 is a plan view of the light emitting device according to the embodiment.

FIG. 1 is a cross-sectional view of a light emitting device 100 according to an embodiment, and FIG. 2 is an extended view of an A portion in FIG. 1. FIG. 3 is a plan view of the light emitting device 100 according to the embodiment.

Referring to FIGS. 1 and 3, the light emitting device 100 according to the embodiment may include a conductive support member 160, an adhesive layer 158 on the conductive support member 160, a reflective layer 157 on the adhesive layer 158, an ohmic contact layer 156 on the reflective layer 157, a protective layer (channel layer) 155 at a peripheral region on an upper surface of the adhesive layer 158, a light emitting structure 145 on the ohmic contact layer 156 and the protective layer 155, a passivation layer 163 on at least a side surface of the light emitting structure 145, an electrode 170 on an upper surface of the light emitting structure 145, and an oxide layer 165 between the electrode 170 and the light emitting structure 145. The light emitting structure 145 may include an oxygen-injected region where oxygen is injected on its upper portion.

The conductive support member 160 supports the light emitting device 100, and provides a power to the light emitting structure 145 together with the electrode 170.

The conductive support member 160 may include at least one selected from the group consisting of Ti, Cr, Ni, Al, Pt, Au, W, Cu, Mo and a carrier wafer, such as Si, Ge, GaAs, ZnO, SiC, SiGe, or GaN.

The adhesive layer 158 may be formed on the conductive support member 160. The adhesive layer 158 may be formed between the light emitting structure 145 and the conductive support member 160 to bond them. The adhesive layer 158 includes a barrier metal, a bonding metal, etc. For example, the adhesive layer 158 may include at least one of Ti, Au, Sn, Ni, Cr, In, Bi, Cu, Ag, and Ta.

The reflective layer 157 may be formed on the adhesive layer 158. The reflective layer 157 reflects light input from the light emitting structure layer 145, thereby making it possible to improve the light extracting efficiency of the light emitting device 100. The reflective layer 157 may be made of metal having high reflection efficiency. For example, the reflective layer 157 may include at least one of Ag, Ni, Al, Rh, Pd, Ir, Ru, Mg, Zn, Pt, Cu, Au, Hf or an alloy thereof.

The ohmic contact layer 156 is formed on the reflective layer 157. The ohmic contact layer 156 ohmic-contacts the light emitting structure 145 to efficiently supply the power to the light emitting structure 145. The ohmic contact layer 156 may selectively include a transparent conductive material or a metal. For example, the ohmic contact layer 156 may be formed of a single layer or a multi-layer including at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The reflective layer 157 and the ohmic contact layer 156 are not limited to the above. Thus, only one of the reflective layer 157 and the ohmic contact layer 156 may be formed, or both of the reflective layer 157 and the ohmic contact layer 156 may be omitted.

The protective layer 155 may be formed at the peripheral region of the upper surface of the adhesive layer 158. In other words, the protective layer 155 may be formed at the peripheral region between the light emitting structure 145 and the adhesive layer 158. The protective layer 155 increases the distance from the light emitting structure 145 to the adhesive layer 158 and the conductive support member 160, thereby preventing the electrical short.

The protective layer 155 may include transparent materials selected from oxides, nitrides, or insulating materials. For example, the protective layer 155 may selectively include ITO (indium tin oxide), ITO (indium zinc oxide), IZTO (indium zinc tin oxide), IGZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, $ZrO_2$, $Nb_2O_5$, $TiO_2$.

The light emitting structure 145 may be formed on the ohmic contact layer 156 and the protective layer 155.

The light emitting structure 145 is a structure generating a light and may include a plurality compound semiconductor layers. For example, the first conductive type semiconductor layer 130, the active layer 140 under the first conductive type semiconductor layer 130, and the second conductive type semiconductor layer 150 under the active layer 140. For the convenience of the explanation, the second conductive type semiconductor layer 150, the active layer 140, and the first conductive type semiconductor layer 130 will be described in sequence.

For example, the second conductive type semiconductor layer 150 may includes a p-type semiconductor layer. The p-type semiconductor layer may include semiconductor materials having the compositional formula of $In_xAl_yGa_{1-x-y}N$ ($0 \leqq x \leqq 1$, $0 \leqq y \leqq 1$, $0 \leqq x+y \leqq 1$), such as InAlGaN, GaN, AlGaN, InGaN, AlInN, AlN, or InN. In addition, the p-type semiconductor layer may be doped with p type dopant such as Mg, Zn, Ca, Sr, or Ba.

The active layer 140 may be formed on the second conductive type semiconductor layer 150. Electrons (or holes) injected through the first conductive semiconductor layer 130 may be recombined with holes (or electrons) injected through the second conductive semiconductor layer 150 at the active layer 140, so that the active layer 140 emits the light based on the band gap difference of the energy band according to the intrinsic material of the active layer 140.

The active layer 140 may have a single quantum well structure, a multiple quantum well (MQW) structure, a quantum dot structure, or a quantum wire structure, but the embodiment is not limited thereto.

The active layer 140 may include semiconductor materials having the compositional formula of $In_xAl_yGa_{1-x-y}N$ ($0 \leqq x \leqq 1$, $0 \leqq y \leqq 1$, $0 \leqq x+y \leqq 1$). In the case that the active layer 140 has the multiple quantum well (MQW), the active layer 140 may be formed of a plurality of well layers and a plurality of barrier layers. For example, the active layer 140 has a plurality of pairs of an InGaN well layer/GaN barrier layer.

A clad layer (not shown) doped with the n-type or p-type dopant can be formed on and/or under the active layer 140. The clad layer may include an AlGaN layer or an InAlGaN layer.

The first conductive type semiconductor layer 130 may be formed on the active layer 140. For instance, the first conductive semiconductor layer 130 may include an n-type semiconductor layer. The n-type semiconductor layer may include semiconductor materials having the compositional formula of $In_xAl_yGa_{1-x-y}N$ ($0 \leqq x \leqq 1$, $0 \leqq y \leqq 1$, $0 \leqq x+y \leqq 1$), such as InAlGaN, GaN, AlGaN, AlInN, InGaN, AlN, or InN. In addition, the n-type semiconductor layer may be doped with n-type dopant such as Si, Ge, Sn, Se or Te.

Meanwhile, contrary to the above, the first conductive type semiconductor layer 130 may include p-type semiconductor layer, and the second conductive type semiconductor layer 150 may include n-type semiconductor layer. Also, a third conductive type semiconductor layer (not shown) including n type or p-type semiconductor layer may be on the first conductive type semiconductor layer 130. Accordingly, the light emitting device 100 may include at least one of an N-P junction structure, a P-N junction structure, an N-P-N junction structure, and a P-N-P junction structure. In addition, the concentration of the dopant may be uniform or non-uniform in the first conductive type semiconductor layer 130 and the second conductive type semiconductor layer 150. That is, the light emitting structure 145 can have various structures, and the embodiment is not limited thereto.

In the embodiment, the oxygen-injected region 135 where oxygen is injected may be formed on the upper portion of the light emitting structure 145 (that is, the upper portion of the first conductive type semiconductor layer 130). For example, the oxygen-injected region 135 may be formed by an oxygen plasma treatment process, but is not limited thereto.

In the case that the first conductive type semiconductor layer 130 includes gallium nitride (GaN), and the gallium (Ga) is outdiffused to an upper surface of the first conductive type semiconductor layer 130 by forming the oxygen-injected region 135 on the first conductive type semiconductor layer 130.

That is, the Ga contained in the first conductive type semiconductor layer 130 is guided to move in the upper surface by the oxygen contained in the oxygen-injected region. Thus, the upper surface of the first conductive type semiconductor layer 130 becomes a gallium-rich area.

In the case that the electrode 170 is formed on the Ga-rich area, the contact resistance between the electrode 170 and the Ga-rich area is reduced, compared with the case that the surface of the first conductive type semiconductor layer is a N-face that nitrogen (N2) is located at the upper surface. For example, the contact resistance may be in a range from about $1*10^{-3}$ $\Omega\cdot cm^2$ to about $5*10^{-3}$ $\Omega\cdot cm^2$ (about one-hundredth of the case that the surface of the first conductive type semiconductor layer is the N-face). Thus, according to the embodiment, the contact resistance between the electrode 170 and the Ga-rich area can be greatly reduced by forming the oxygen-injected region 135. Thus, the light emitting efficiency of the light emitting device 100 can be improved and the driving voltage of the light emitting device 100 can decrease.

Also, between the electrode 170 and the light emitting structure 145, an oxide layer 165 may be formed by a combination of the oxygen contained in the oxygen-injected region 135 and the metal contained in a bottom surface of the electrode 170.

Figure 4:
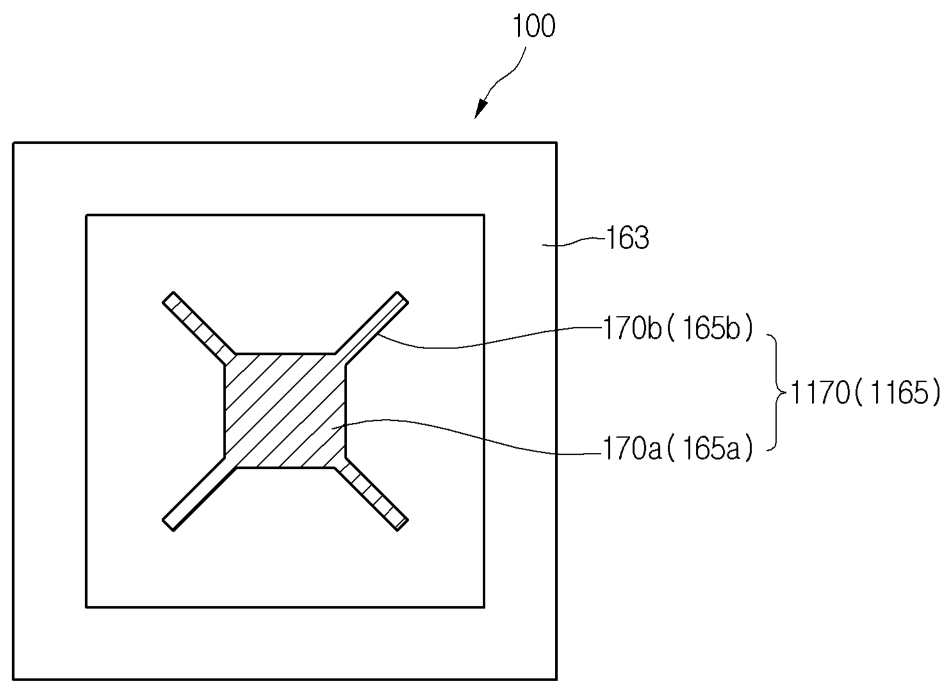
FIG. 4 is a plan view of the light emitting device according to a modified example.
Figure 5:
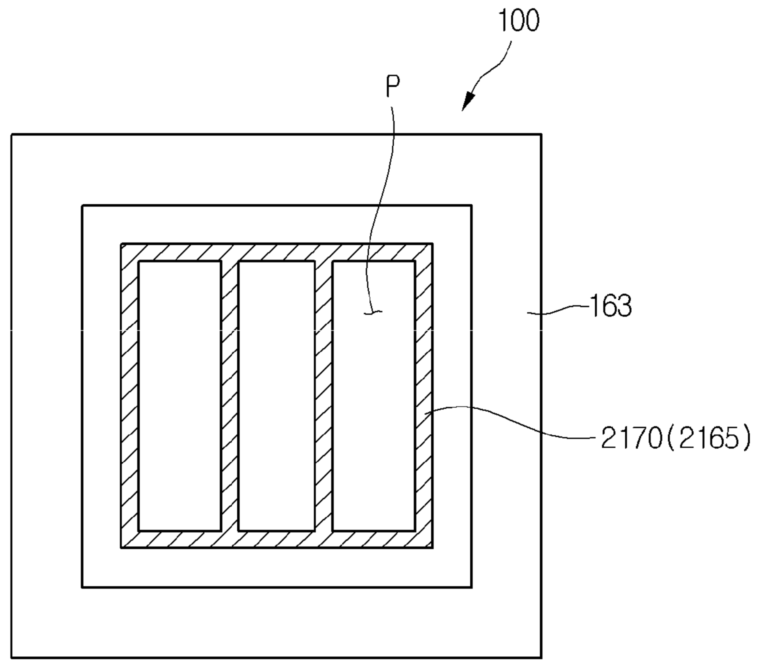
FIG. 5 is a plan view of the light emitting device according to another modified example.

Since the oxide layer 165 is formed by the combination of the oxygen contained in the oxygen-injected region 135 and the metal contained in the electrode 170, the oxide layer 165 has a thickness smaller than that of the oxygen-injected region 135 and that of the electrode 170. Also, because the oxide layer 165 is formed by the combination of the oxygen contained in the oxygen-injected region 135 and the metal contained in the electrode 170, the oxide layer 165 and the electrode 170 have the same shape in a plan view, as shown in FIG. 3, but are not limited thereto. In FIG. 3, the oxide layer 165 and the electrode 170 have rectangular shapes at a center region of the light emitting structure 145. However, the embodiment is not limited thereto. Thus, as shown in FIG. 4, the oxide layer 1165 and the electrode 1170 may have first portions 165*a* and 170*a* at the center region and second portions 165*b* and 170*b* extending from the first portions 165*a* and 170*a* toward corners in diagonal directions, respectively. Alternatively, as shown in FIG. 5, the oxide layer 2165 and the electrode 2170 may include line portions having opening portions P. In this regard, the current can easily spread out.

Referring to FIGS. 1 and 2 again, the oxide layer 165 may include a metal oxide. For example, the oxide layer 165 may include at least one of CrO, $TiO_2$, $Al_2O_3$, AgO, and NiO. The material of the oxide layer 165 depends on the material of the bottom surface of the electrode 170.

The oxide layer 165 may have a thickness of about 0.1 Å to about 100 Å, and thus, the current can flows well by a tunneling effect therethrough. In addition, the oxide layer 165 is formed by the combination of the metal and the oxygen that easily reacts with each other. Thus, the generation of the material having a high insulating property (such as, CrN, GaO) can be prevented, thereby minimizing the increase of the contact resistance between the electrode 170 and the light emitting structure 145.

Hereinafter, a light emitting device according to an embodiment will be described in more detail with reference to FIGS. 6 to 8.

Figure 6:
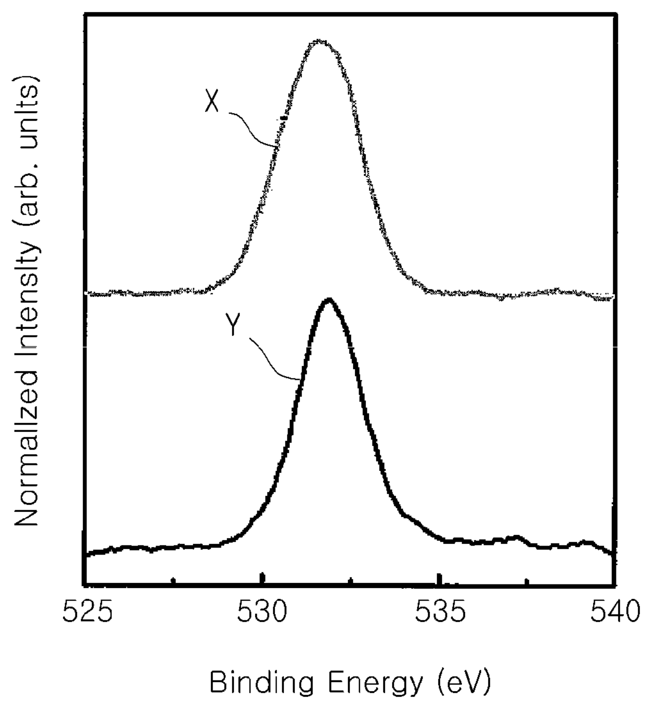
FIG. 6 is a graph showing elementary analysis results of an interface between an electrode and a light emitting structure in a light emitting device according to an exemplary embodiment and a comparative embodiment.

The elementary analysis results of an interface between an electrode and a light emitting structure in a light emitting device according to Exemplary embodiment and Comparative embodiment was shown in FIG. 6. The result was measured by AES (Auger Electron Spectroscopy). In Exemplary embodiment, oxygen was injected to a light emitting structure 145. In Comparative embodiment, oxygen was not injected to a light emitting structure.

Referring to FIG. 6, the width of oxygen peak generated between the light emitting structure 145 and an electrode 170 was broaden in the case (X) that an oxygen-injected region 135 was formed at the light emitting structure 145 according to Exemplary embodiment, compared with the case (Y) that the oxygen-injected region was not formed at the light emitting structure according to Comparative embodiment.

The increases in the width of oxygen peak was because of the generation of the oxygen compound at an interface between the electrode 170 and the light emitting structure 145. Thus, it can be seen that the oxide layer 165 was formed.

Figure 7:
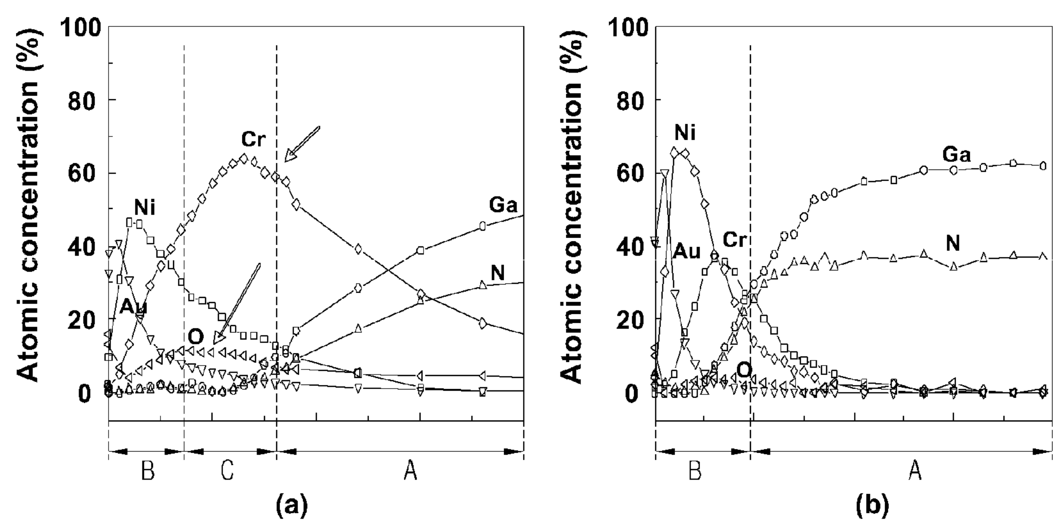
FIG. 7 is a graph showing an atomic concentration in the light emitting device according to an exemplary embodiment and comparative embodiment.

The atomic concentration in the light emitting device according to Exemplary embodiment was shown in (a) of FIG. 7, and the atomic concentration in the light emitting device according to Comparative embodiment was shown in (b) of FIG. 7.

In more detail, the first conductive type semiconductor layer 130 included GaN, the electrode 170 included a first layer 171 having Cr, a second layer 172 having Ni, and a third layer 173 having Au. The Exemplary embodiment and Comparative embodiment are only different from each other in that the oxygen was injected to a light emitting structure 145 in Exemplary embodiment and the oxygen was not injected to the light emitting structure in Comparative embodiment.

Referring to (a) of FIG. 7, it can be seen that a portion C was formed between a portion A and a portion B. Here, the concentration of Ga and N were high in the portion A (that is, the light emitting structure portion), the concentration of Cr, Ni and Au were high in the portion B (that is, the electrode portion), and the concentration of Cr and O were high in the portion C (that is, the oxide layer portion). That is, it can be seen that the oxide layer 165 having CrO was formed between the light emitting structure 145 and the electrode 170 by the combination of the Cr contained in the first layer 171 and the oxygen. On the other hand, in (b) of FIG. 7, the oxide layer portion was not formed.

Last, a voltage-current of the light emitting device according to Exemplary embodiment and Comparative embodiment was measured by a TLM (transfer length method).

Figure 8:
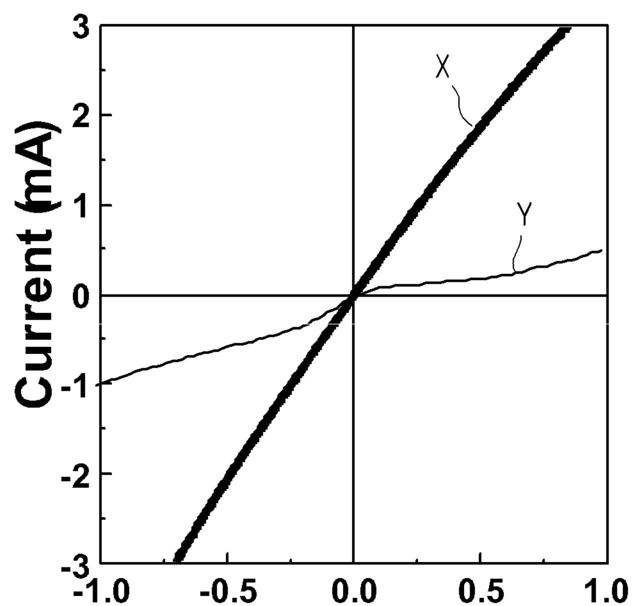
FIG. 8 is a voltage-current graph of the light emitting device according to exemplary embodiment and comparative embodiment.

Referring to FIG. 8, it can be seen that the contact resistance of the case (X) according to Exemplary embodiment was smaller than that of the case (Y) according to Comparative embodiment. That is, according to an Exemplary embodiment, the contact resistance between the light emitting structure 145 and the electrode 170 can be reduced, and thus the light emitting efficiency can be improved.

Meanwhile, the Ga-rich area and a portion of the oxide layer 165 may be overlapped with each other, and thus, it is possible that the Ga-rich area and the oxide layer are not clearly discriminated. In this case, the oxide layer 165 and the Ga-rich area may coexist between the light emitting structure 145 and the electrode 170 as shown in the above result.

Referring to FIGS. 1 and 2 again, the electrode 170 may be formed on the oxide layer 165. The electrode 170 may supply the power to the light emitting device 100, together with the conductive support member 160.

As shown in FIG. 2, the electrode 170 may have a plurality of layers.

In more detail, a first layer 171 as the lowest layer includes a metal forming an ohmic contact with the light emitting structure 145. For example, the first layer 171 may include at least one of Cr, Cr-Alloy, Al, Al-Alloy, Ti, Ti-Alloy, Ag, Ag-Alloy, Ni or Ni-Alloy.

A third layer 173 as the highest layer includes a metal that the wire can be easily bonded. For example, the third layer 173 may be formed in a single layer or multi-layer structure including at least one of Au, Al, Cu, or Cu-Alloy.

A second layer 172 between the first layer 171 and the third layer 173 may include a material that can prevent an inter-diffusion between the first layer 171 and the third layer 173. For example, the second layer 172 may includes at least one of Ni, Ni-Alloy, Ti, or Ti-Alloy. However, the embodiment is not limited to the above structure of the electrode 170.

The passivation layer 163 may be formed on at least a side surface of the light emitting structure 145. The passivation layer 163 may be formed to electrically insulate the side surface of the light emitting structure 145 from an outer electrode (not shown), but is not limited thereto.

As shown, one end of the passivation layer 163 may be formed on the upper surface of the light emitting structure 145 and the other end of the passivation layer 163 may be formed on the protective layer 155. However, the present invention is not limited thereto.

For example, the passivation layer 163 may include $SiO_2$, $SiO_x$, $SiO_xN_y$, $Si_3N_4$, or $Al_2O_3$ but is not limited thereto.

Hereinafter, a method for manufacturing a light emitting device 100 according to the embodiment will be described in detail.

FIGS. 9 to 15 are cross-sectional views illustrating a method of manufacturing a light emitting device 100 according to an embodiment.

Figure 9:
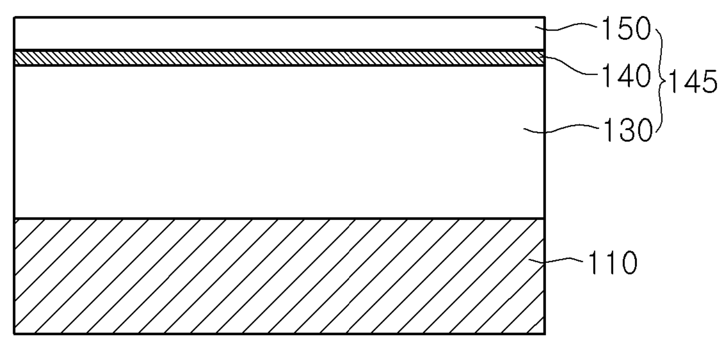
FIGS. 9 to 15 are cross-sectional views illustrating a method of manufacturing a light emitting device according to an embodiment.

Referring to FIG. 9, the light emitting structure 145 may be formed on a growth substrate 110.

The growth substrate 110 may be made of at least one of, for example, sapphire ($Al_2O_3$), SiC, GaAs, GaN, ZnO, Si, GaP, InP, and Ge, but is not limited thereto.

The light emitting structure 145 may be formed by growing the first conductive type semiconductor layer 130, the active layer 140, and the second conductive type semiconductor layer 150 on the growth substrate 110.

The light emitting structure 145 may be formed, for example, using a MOCVD (Metal Organic Chemical Vapor Deposition) method, a CVD (Chemical Vapor Deposition) method, a PECVD (Plasma-Enhanced Chemical Vapor Deposition) method, an MBE (Molecular Beam Epitaxy) method, an HVPE (Hydride Vapor Phase Epitaxy) method, etc., but is not limited thereto.

Meanwhile, a buffer layer (not shown) may be formed to relieve lattice mismatch due to a lattice constant difference between the light emitting structure 145 and the growth substrate 110.

Figure 10:
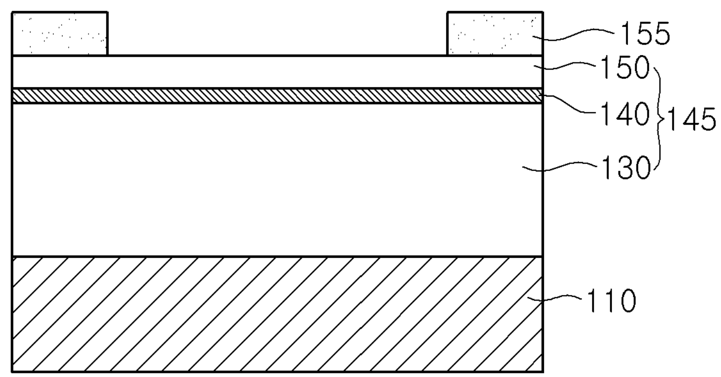

Referring to FIG. 10, the protective layer 155 may be formed at a peripheral region on the upper surface of the light emitting structure 145.

The protective layer 155 may be formed, for example, using a PECVD (Plasma-Enhanced Chemical Vapor Deposition) method, an E-beam deposition method, etc., but is not limited thereto.

Figure 11:
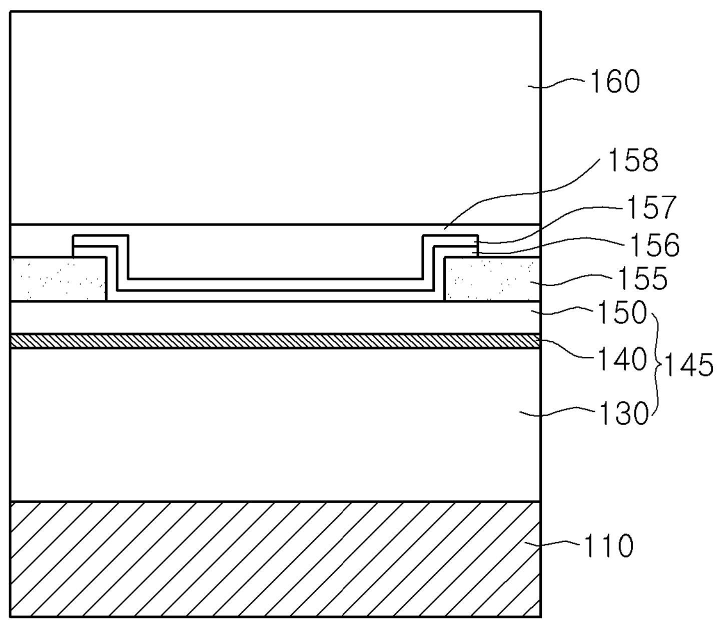

Referring to FIG. 11, the ohmic contact layer 156, the reflective layer 157, the adhesive layer 158, and the conductive support member 160 may be sequentially formed on the light emitting structure 145.

The ohmic contact layer 156, the reflective layer 157, and the adhesive layer 158 may be formed by, for example, a PECVD (Plasma-Enhanced Chemical Vapor Deposition) method, a sputtering method, an E-beam method, a sputtering method, etc. In the case that the ohmic contact layer 156, the reflective layer 157, or the adhesive layer 158 is formed of a metal, it may be formed by a plating method.

The conductive support member 160 may be formed by the plating manner or the deposition manner. Alternatively, the conductive support member 160 of a separate sheet may be attached by the bonding manner.

Figure 12:
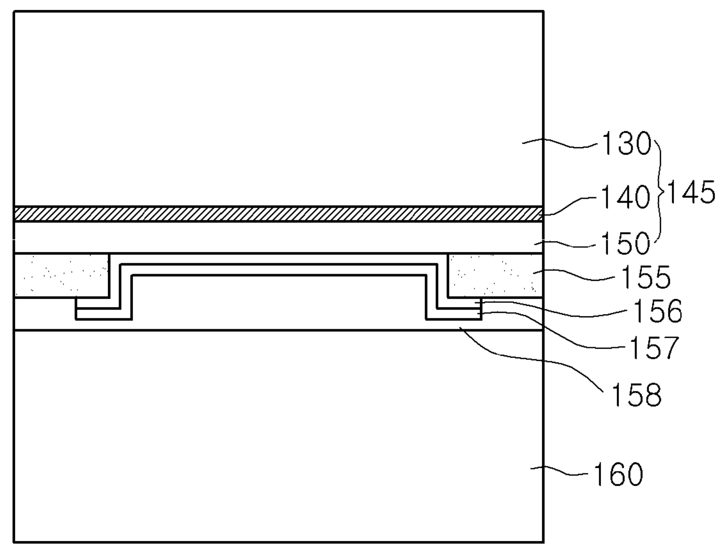

Referring to FIG. 12, the growth substrate 110 may be removed from the light emitting structure 145.

The growth substrate 110 may be removed by a laser lift off method or an etching method but is not limited thereto. FIG. 12 shows the case where the structure shown in FIG. 11 is turned over, because the process removing the growth substrate 110 and the subsequent processes are performed at the bottom surface of the light emitting structure 145 of FIG. 11.

Referring to FIG. 10, the light emitting structure layer 145 is subject to the isolation etching along the unit chip region, such that the plurality of light emitting structure 145 is separated. For example, the isolation etching may be performed by a dry etching method such as an inductively coupled plasma (ICP) method.

The upper surface of the first conductive type semiconductor layer 130 of the light emitting structure 145 is exposed by removing the growth substrate 110.

Figure 13:
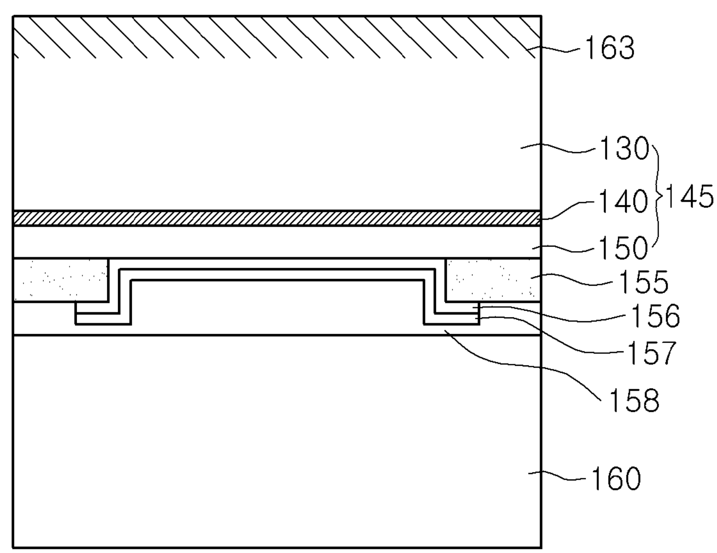

Referring to FIG. 13, the oxygen is injected to the exposed upper region of the first conductive type semiconductor layer 130, thereby forming the oxygen-injected region 135.

The oxygen-injected region 135 may be formed by, for example, an oxygen plasma treatment process.

That is, the Ga contained in the first conductive type semiconductor layer 130 is guided to move toward its upper surface by forming the oxygen-injected region 135. Thus, the surface of the first conductive type semiconductor layer 130 become a Ga-rich area.

As described above, the Ga-rich area achieve the low contact resistance from about $1*10^{-3}$ $\Omega\cdot cm^2$ to about $5*10^{-3}$ $\Omega\cdot cm^2$. Thus, according to the embodiment, the driving voltage of the light emitting device 100 can decrease and the light emitting efficiency of the light emitting device 100 can be improved.

Figure 14:
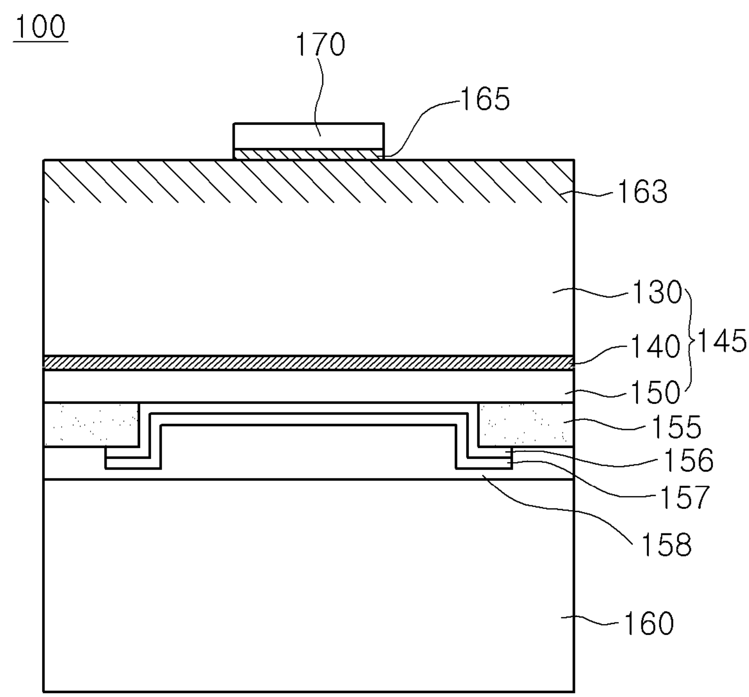

Referring to FIG. 14, the electrode 170 may be formed on the first conductive type semiconductor layer 130.

Then, the oxide layer 165 with a thickness from 0.1 Å to 100 Å may be formed by a combination of the oxygen contained in the Ga-rich area at the first conductive type semiconductor layer 130 and the metal contained in the bottom surface of the electrode 170.

Thus, the oxide layer 165 may include a metal oxide. For example, the oxide layer 165 may include at least one of CrO, $TiO_2$, $Al_2O_3$, AgO or NiO. Since the oxide layer 165 is thin, the current can flows well between the electrode 170 and the light emitting structure 145 by a tunneling effect. Also, the generation of the material having a high insulating property (such as, CrN, GaO) can be prevented.

Figure 15:
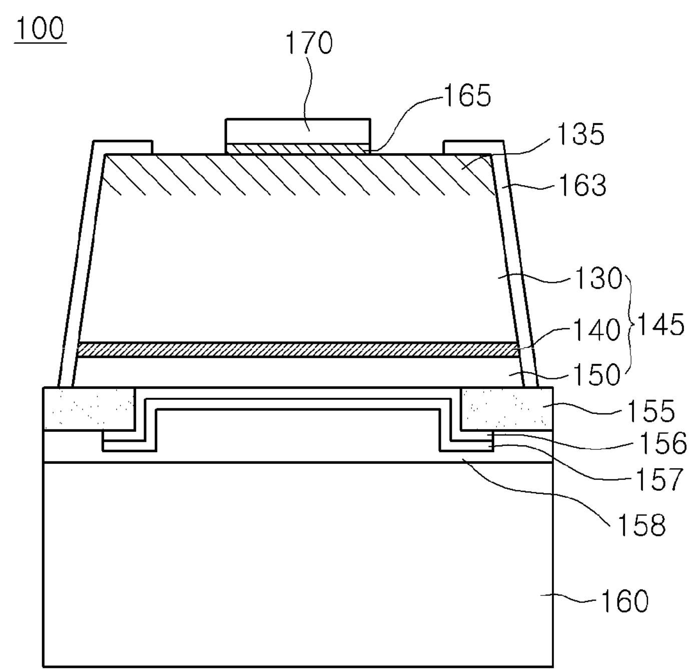

Referring to FIG. 15, the light emitting structure 145 is subject to the isolation etching and the passivation 163 is formed on at least the side surface of the light emitting structure 145. Then, the light emitting device 100 according to the embodiment can be provided.

By the above isolation etching, a plurality of light emitting devices 100 can be separated to unit devices. For example, the isolation etching may be performed by a dry etching method such as an inductively coupled plasma (ICP) method.

The passivation 163 may formed by deposition manners such as PECVD, sputtering, or E-beam deposition.

Figure 16:
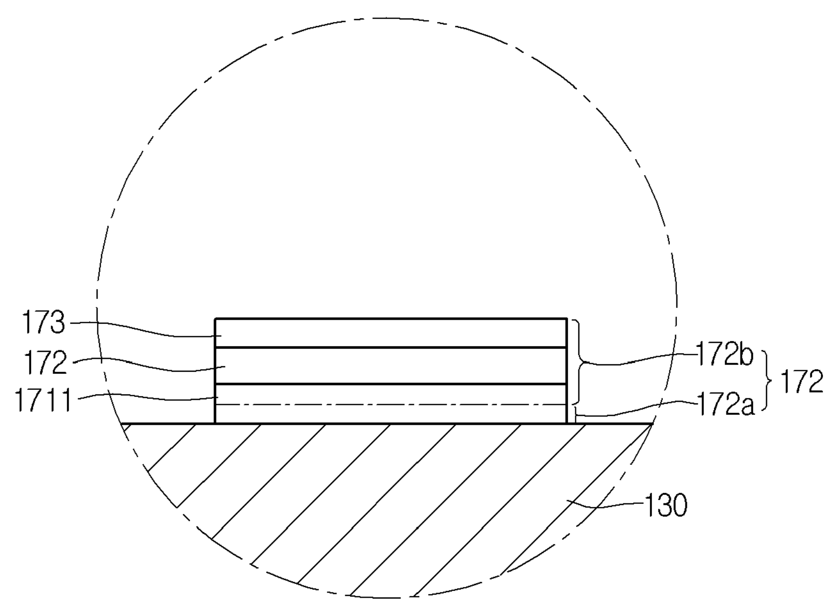
FIG. 16 is an extended view of an electrode according to still another modified example.

In the above embodiment, the oxide layer 165 is formed between the electrode 170 and the light emitting structure 145, but is not limited thereto. Thus, shown in FIG. 16, it is possible that the oxide layer 165 (in FIG. 1) is not separately formed. In this case, an oxygen concentration of a first region 172*a* is higher than an oxygen concentration of a second region 172*b*. Here, the first region 172*a* of the electrode 172 is adjacent to the light emitting structure 145 (in FIG. 1) (in more detail, the first conductive type semiconductor layer 130), and the second region 172*b* is formed on the first region 172*a*. The first region 172*a* includes the metal contained in the lowest layer of the electrode 172. For example, the first region 172*a* may include CrO, $TiO_2$, $Al_2O_3$, AgO, or NiO. Here, the first region 172*a* may be thinner than the lowest layer of the electrode 172 (that is, the first layer 1711). The first, second, and third layers 1711, 172, and 173 are described in the above, and the detailed description will be omitted.

Figure 17:
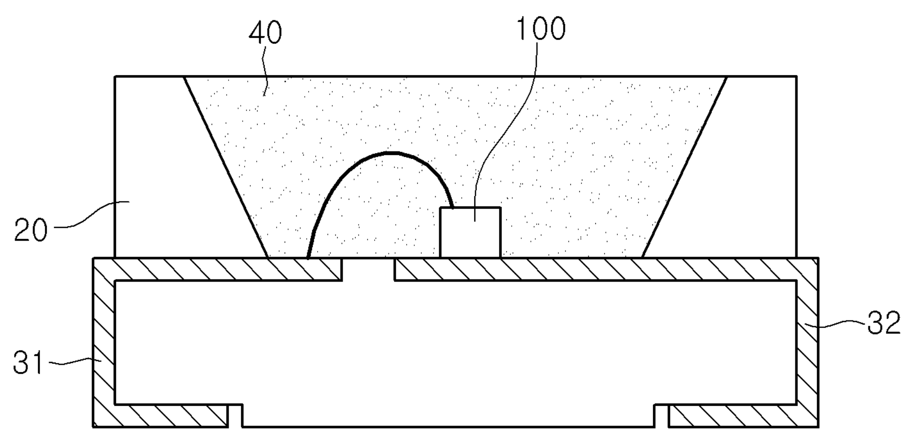
FIG. 17 is a cross-sectional view of a light emitting device package including a light emitting device according to embodiments.

FIG. 17 is a cross-sectional view of a light emitting device package including a light emitting device according to embodiments.

Referring to FIG. 17, the light emitting device package according to the embodiment includes a package body 20, first and second electrode layers 31 and 32 mounted on the package body 20, a light emitting device 100 according to the embodiments, which is mounted on the package body 20 and electrically connected to the first and second electrode layers 31 and 32, and a molding member 40 enclosing the light emitting device 100.

The package body 20 may be formed including a silicon material, a synthetic resin material, or a metallic material, and may have an inclination surface around the light emitting device 100.

The first electrode layer 31 and the second electrode layer 32 are electrically separated, and supply an electric power to the light emitting device 100. Also, the first and second electrode layers 31 and 32 may reflect light generated from the light emitting device 100 to thus increase light efficiency, and may emit heat generated from the light emitting device 100 to an outside.

The light emitting device 100 may be mounted on the package body 20 or on the first electrode layer 31 or the second electrode layer 32.

The light emitting device 100 may be electrically connected to the first electrode layer 31 and the second electrode layer 32 by using any one of a wire bonding method, a flip chip method, or a die bonding method.

The molding member 40 may enclose and protect the light emitting device 100. Also, a fluorescent material may be included in the molding member 40 to change the wavelength of light emitted from the light emitting device 100.

The light emitting device package according to the current embodiment may mount at least one of the light emitting devices according to the foregoing embodiments, but the present invention is not limited thereto. The light emitting device package may include a plurality of light emitting device packages which are arrayed on a substrate. A plurality of optical members, such as a light guide panel, a prism sheet, a diffusion sheet, a fluorescent sheet, and the like may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 18:
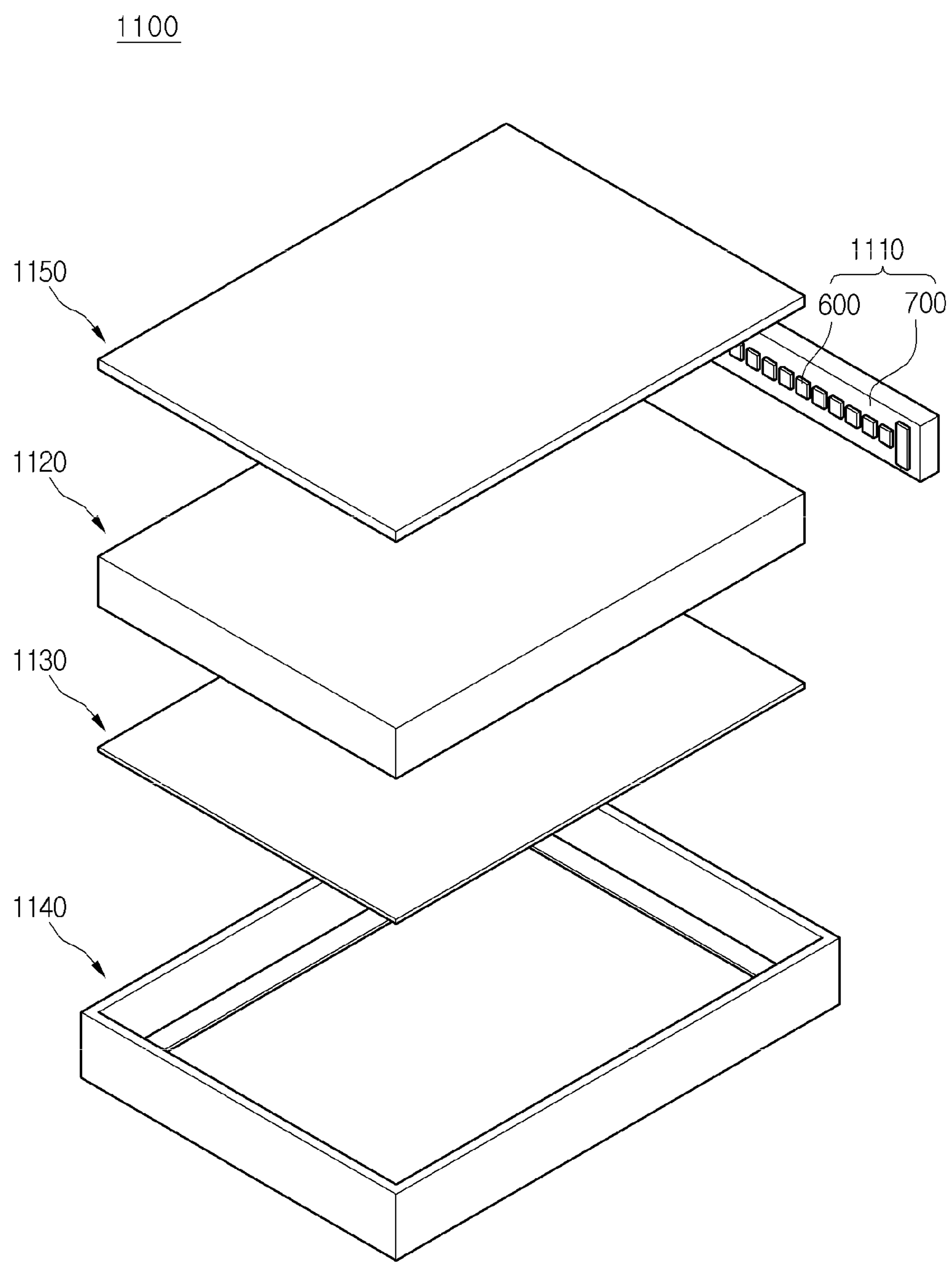
FIG. 18 is a disassembled perspective view of a backlight unit including a light emitting device or a light emitting device package according to an embodiment.

FIG. 18 is a disassembled perspective view of a backlight unit including a light emitting device or a light emitting device package according to an embodiment. The backlight unit 1100 of FIG. 18 is one example of lighting systems, and the present invention is not limited thereto.

Referring to FIG. 18, the backlight unit 1100 may include a bottom cover 1140, a light guide member 1120 disposed in the bottom cover 1140, and a light emitting module 1110 disposed on at least one side surface of the light guide member 1120 or under the light guide member 1120. Also, a reflective sheet 1130 may be disposed under the light guide member 1120.

The bottom cover 1140 may be formed in a box shape a top surface of which is opened such that the light guide member 1120, the light emitting module 1110 and the reflective sheet 1130 can be received. The bottom cover 1140 may be formed of a metal or resin material, but the invention is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is exemplarily shown that the light emitting device packages 600 are mounted on the substrate 700, but the light emitting devices according to the embodiments may be mounted directly on the substrate 700.

As shown in FIG. 18, the light emitting module 1110 may be disposed on at least one of inner side surfaces of the bottom cover 1140, and thus may provide light to at least one of the side surfaces of the light guide member 1120.

It is also to be understood that the light emitting module 1110 may be disposed under the light guide member 1120 inside the bottom cover 1140 to provide light toward a bottom surface of the light guide member 1120. However, since such a constitution may be modified according to the design of the backlight unit 1100, the invention is not limited thereto.

The light guide member 1120 may be disposed inside the bottom cover 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthalate (PET), poly carbonate (PC), COC, and polyethylene naphthalate resin.

An optical sheet 1150 may be disposed on the light guide member 1120.

The optical sheet 1150 may include, for example, at least one of a diffusion sheet, a light-condensing sheet, a brightness enhancement sheet and a fluorescent sheet. For example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet. At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120. The reflective sheet 1130 may reflect light emitted from the bottom surface of the light guide member 1120 toward a light emitting surface of the light guide member 1120.

The reflective sheet 1130 may be formed of resin material having good reflectivity, for example, PET, PC, PVC resins, or the like, but the invention is not limited thereto.

Figure 19:
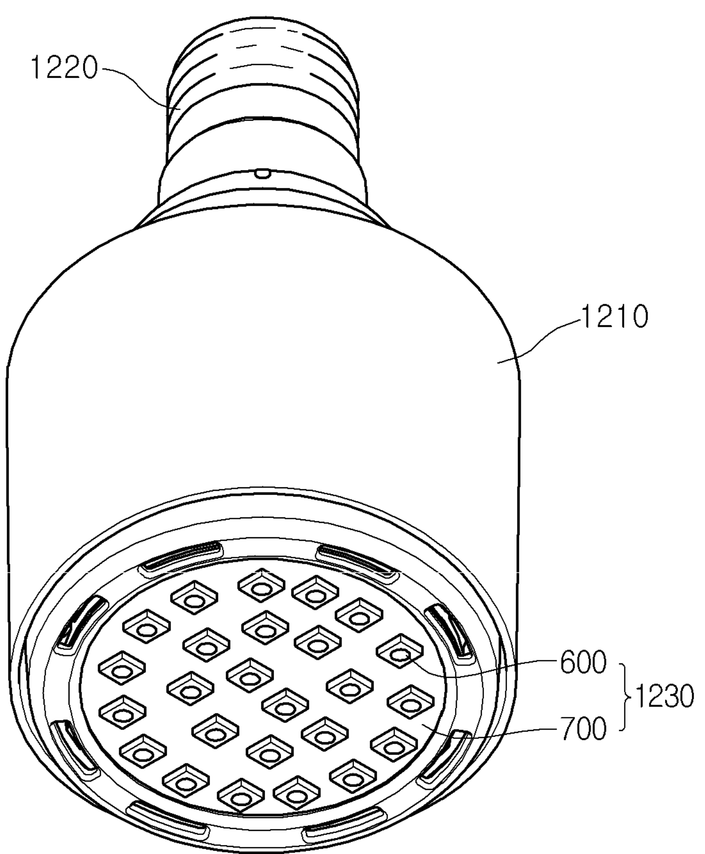
FIG. 19 is a perspective view of a lighting unit including a light emitting device or a light emitting device package according to an embodiment.

FIG. 19 is a perspective view of a lighting unit including a light emitting device or a light emitting device package according to an embodiment. The lighting unit 1200 of FIG. 19 is an example of lighting systems and the invention is not limited thereto.

Referring to FIG. 19, the lighting unit 1200 may include a case body 1210, a light emitting module 1230 installed in the case body 1210, and a connection terminal installed in the case body 1210 to be supplied with an electric power from an external power source.

The case body 1210 may be preferably formed of a material having good heat shielding characteristic, for example, a metal material or a resin material.

The light emitting module 1230 may include a substrate 700, and a light emitting device package 600 mounted on the substrate 700. In the light emitting module 1230 according to the current embodiment, it is exemplarily shown that the light emitting device packages 600 are mounted on the substrate 700, but the light emitting devices according to the embodiments may be mounted directly on the substrate 700.

The substrate 700 may be an insulator substrate on which a circuit pattern is printed, and may include, for example, a general printed circuit board (PCB), a metal core PCB, a flexible PCB, a ceramic PCB, etc.

Also, the substrate 700 may be formed of a material to efficiently reflect light, and a surface thereof may be formed in a color capable of efficiently reflecting light, for example, white color, silver color, or the like.

At least one light emitting device package 600 may be mounted on the substrate 700. Each of the light emitting device packages 600 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply an electric power to the light emitting module 1230. As shown in FIG. 19, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect.

As described above, since the lighting system according to this embodiment includes the light emitting device or light emitting device package capable of emitting light having a high light emitting efficiency, the lighting system can show superior characteristics.

Any reference in this specification to “one embodiment,” “an embodiment,” “example embodiment,” etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:

a conductive support member;

a light emitting structure for generating a light on the conductive support member, the light emitting structure comprising a first conductive type semiconductor layer, a second conductive type semiconductor layer, and an active layer;

an electrode on the light emitting structure; and an oxide layer between the electrode and the light emitting structure, wherein the light emitting structure comprises an oxygen-injected region where oxygen is injected on an upper portion of the light emitting structure, wherein a thickness of the oxide layer is in a range from about 0.1 Å to about 100 Å, wherein the upper portion of the light emitting structure includes gallium nitride (GaN), and the gallium is out-diffused to an upper surface of the light emitting structure by the oxygen in the oxygen-injected region, the electrode comprises a plurality of layers, wherein the oxide layer comprises at least one of CrO, $TiO_2$, $Al_2O_3$, AgO or NiO, wherein the contact resistance between the light emitting structure and the electrode is in a range from about $1*10^{-3}$ Ω·cm$^2$ to about $5*10^{-3}$ Ω·cm$^2$, and wherein an lowest layer of the electrode comprises at least one of Cr, Cr-Alloy, Al, Al-Alloy, Ti, Ti-Alloy, Ag, Ag-Alloy, Ni and Ni-Alloy.

2. The light emitting device of claim 1, further comprising:

at least one of an ohmic contact layer and a reflective layer between the conductive support member and the light emitting structure.

3. The light emitting device of claim 1, further comprising:

a passivation layer formed on at least a side surface of the light emitting structure.

4. The light emitting device of claim 1, further comprising:

a channel formed at a peripheral region between the conductive support member and the light emitting structure.

5. A light emitting device package comprising:

a package body;

a first and second electrode layers on the package body; and a light emitting device on the package body, the light emitting body electrically connected to the first and second electrode layers, wherein the light emitting device comprises:

a conductive support member;

a light emitting structure for generating a light on the conductive support member;

an electrode on the light emitting structure, and an oxide layer between the electrode and the light emitting structure, wherein the light emitting structure comprises an oxygen-injected region where oxygen is injected on an upper portion of the light emitting structure, wherein a thickness of the oxide layer is in a range from about 0.1 Å to about 100 Å, wherein the upper portion of the light emitting structure includes gallium nitride (GaN), and the gallium is out-diffused to an upper surface of the light emitting structure by the oxygen in the oxygen-injected region, the electrode comprises a plurality of layers, wherein the oxide layer comprises at least one of CrO, $TiO_2$, $Al_2O_3$, AgO or NiO, wherein the contact resistance between the light emitting structure and the electrode is in a range from about $1*10^{-3}$ Ω·cm$^2$ to about $5*10^{-3}$ Ω·cm$^2$, and wherein an lowest layer of the electrode comprises at least one of Cr, Cr-Alloy, Al, Al-Alloy, Ti, Ti-Alloy, Ag, Ag-Alloy, Ni and Ni-Alloy.

* * * * *